US006727995B1

(12) United States Patent
Halliyal et al.

(10) Patent No.: US 6,727,995 B1
(45) Date of Patent: Apr. 27, 2004

(54) GATE OXIDE THICKNESS MEASUREMENT AND CONTROL USING SCATTEROMETRY

(75) Inventors: Arvind Halliyal, Sunnyvale, CA (US); Bhanwar Singh, Morgan Hill, CA (US); Ramkumar Subramanian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 314 days.

(21) Appl. No.: 09/903,884

(22) Filed: Jul. 12, 2001

(51) Int. Cl.$^7$ ............................................... G01B 11/06
(52) U.S. Cl. ................. 356/630; 356/237.5; 356/239.7; 324/158.1; 438/16
(58) Field of Search ........................... 356/239.7, 239.8, 356/237.2–237.5, 600, 630–632; 250/559.27; 324/752, 765, 158.1; 438/263, 786, 514, 14–18, 767; 702/181; 700/108, 109, 121

(56) References Cited

U.S. PATENT DOCUMENTS 6,124,178 A * 9/2000 Sung et al. .................. 438/308
6,561,706 B2 * 5/2003 Singh et al. ................. 396/611

OTHER PUBLICATIONS

Niu, X., et al., "Specular Spectroscopic Scatterometry in DUV Lithography," Timbre Technology, Inc., et al.
Smith, T., et al., "Process Control in the Semiconductor Industry," http://www.mtl.mit.edu taber Research Process Control IERC99 pp 1–24.
Cote, D.R., et al., "Plasma–assisted chemical vapor deposition of dielectric thin films for ULSI semiconductor circuits," IBM Journal of Research & Development, vol. 43, No. 112 pp 1–30.

* cited by examiner

Primary Examiner—Richard A. Rosenberger
Assistant Examiner—Vincent P. Barth
(74) Attorney, Agent, or Firm—Amin & Turocy, LLP (57) ABSTRACT

A system for regulating gate oxide layer formation is provided. The system includes one or more light sources, each light source directing light to one or more gate oxide layers being deposited and/or formed on a wafer. Light reflected from the gate oxide layers is collected by a measuring system, which processes the collected light. The collected light is indicative of the thickness and/or uniformity of the respective gate oxide layers on the wafer. The measuring system provides thickness and/or uniformity related data to a processor that determines the thickness and/or uniformity of the respective gate oxide layers on the wafer. The system also includes a plurality of gate oxide layer formers where each gate oxide former corresponds to a respective portion of the wafer and provides for gate oxide layer formation thereon. The processor selectively controls the gate oxide layer formers to regulate gate oxide layer formation on the respective gate oxide layer formations on the wafer.

19 Claims, 11 Drawing Sheets

GATE OXIDE THICKNESS MEASUREMENT AND CONTROL USING SCATTEROMETRY

TECHNICAL FIELD

The present invention generally relates to semiconductor processing, and in particular to systems and methods for regulating the formation of a gate oxide layer in MOSFET semiconductor devices.

BACKGROUND OF THE INVENTION

In the semiconductor industry, there is a continuing trend toward manufacturing integrated circuits with a greater number of layers and with higher device densities. To achieve these high densities there have been, and continue to be, efforts towards reducing the thickness of layers, improving the uniformity of layers, reducing the thickness of devices and scaling down device dimensions (e.g., at sub micron levels) on semiconductor wafers. In order to accomplish higher device packing densities, thinner layers, more uniform layers, smaller feature sizes, and smaller separations between features are required. This can include the thickness of gate oxide materials, (e.g, silicon oxide, silicon nitride, silicon oxynitride, metal oxides and high K materials such as $ZrO_2$ and $HfO_2$ and metal silicates of Hf, Zr, La, etc.), interconnecting lines, spacing and diameter of contact holes, and the surface geometry such as corners and edges of various features.

The process of manufacturing semiconductors, or integrated circuits (commonly called ICs, or chips), typically consists of more than a hundred steps, during which hundreds of copies of an integrated circuit can be formed on a single wafer. Generally, the process involves creating several layers on and in a substrate that ultimately forms the complete integrated circuit. This layering process can create electrically active regions in and on the semiconductor wafer surface. Insulation and conductivity between such electrically active regions can be important to reliable operation of such integrated circuits. Thus, controlling the width, thickness and/or uniformity of layers created during the layering process can be important to the reliable operation of such integrated circuits. Insulation and conductivity between electrically active regions is important in MOSFET (Metal Oxide Semiconductor Field Effect Transistor) semiconductor devices.

Figure 1:
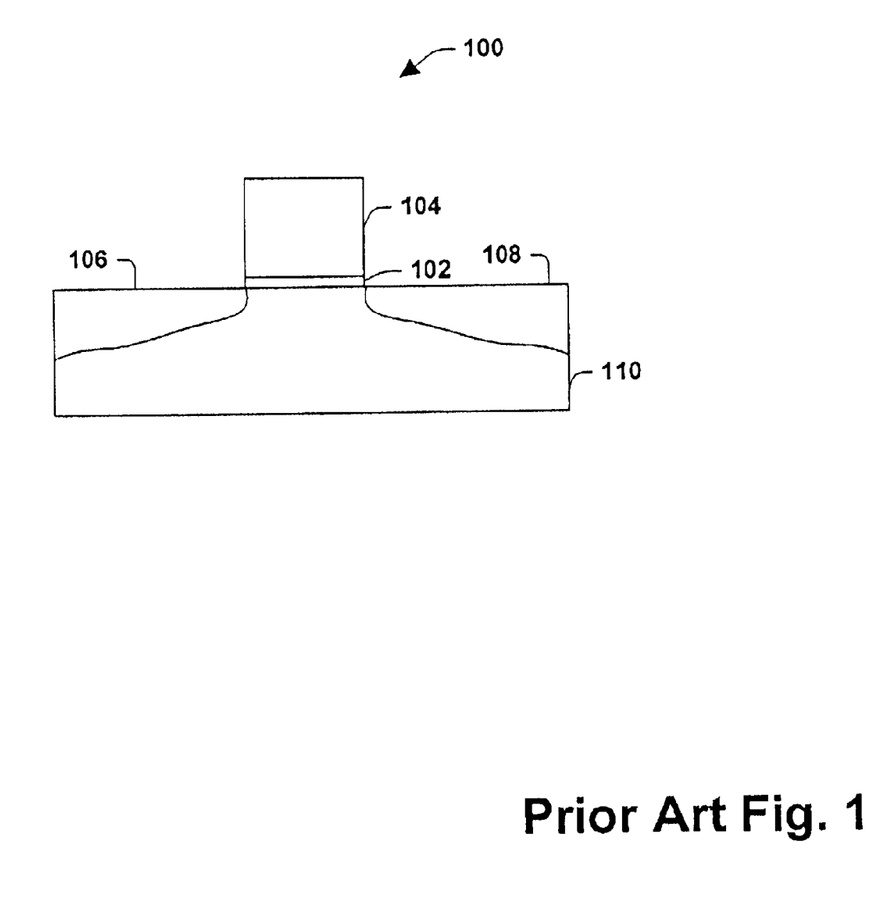
FIG. 1 is a cross section of an exemplary MOSFET device.

An exemplary MOSFET device 100 is illustrated in Prior Art. FIG. 1. The exemplary MOSFET device 100 illustrated includes a gate 104 separated from a substrate 110 by a gate oxide 102. The MOSFET includes a source 106 and a drain 108. The thickness of the gate oxide 102 can be important to reliable operation of the MOSFET 100, and thus, manufacturing the gate oxide 102 to precise measurements facilitates increasing MOSFET reliability.

The gate oxide layer 102 functions as an insulating layer. The gate oxide layer 102 can be the smallest feature of a device. Reducing the thickness of the gate oxide layer 102 can contribute to increasing the switching speed of a transistor. But reducing the thickness of the gate oxide layer 102 can lead to problems associated with breakdown and reliability of gate oxides. Thus, precisely monitoring and controlling properties of the gate oxide layer 102 including, but not limited to, thickness and uniformity, are important to facilitating reliable operation of the MOSFET 100. For example, the ability to store data, to retain data, to be erased, to be reprogrammed and to operate in desired electrical and temperature ranges can be affected by the thickness and/or uniformity of the gate oxide layer 102.

In stacked gate oxide films, the gate oxide is comprised of at least two layers but it is to be appreciated that it may be formed from two, three or more layers. The gate oxide is a very thin film, and thus precisely and uniformly forming sublayers having even smaller thickness than the gate oxide film is extremely difficult.

The requirement of small features with close spacing between adjacent features in MOSFET devices requires sophisticated manufacturing techniques including precise control of gate oxide layer formation. Furthermore, precise control of layers employed in fabricating stacked gate oxides similarly requires precise control. Fabricating a MOSFET device using such sophisticated techniques may involve a series of steps including the formation of layers/structures by chemical vapor deposition (CVD), rapid thermal oxidation, metalorganic CVD (MOCVD), atomic layer CVD (ALCVD), pulsed laser deposition (PLD), thermal oxide growth and other deposition processes. Difficulties in forming a gate oxide layer with precise thickness and/or uniformity have limited the effectiveness and/or properties of MOSFET devices manufactured by conventional techniques.

Due to the extremely fine structures that are fabricated on a MOSFET device, controlling the thickness of gate oxide layers employed to form a stacked gate oxide are significant factors in achieving desired critical dimensions and operating properties and thus in manufacturing a reliable MOSFET device. The more precisely the gate oxide can be formed, the more precisely critical dimensions may be achieved, with a corresponding increase in MOSFET device reliability. Conventionally, due to non-uniform and uncontrolled gate oxide layer formation and inaccurate gate oxide layer formation monitoring techniques, a thickness of gate oxide may be formed greater or lesser than the thickness desired.

SUMMARY OF THE INVENTION

This section presents a simplified summary of the invention in order to provide a basic understanding of some aspects of the invention. This summary is not an extensive overview of the invention. It is not intended to identify key/critical elements of the invention nor is it intended to delineate the scope of the invention. Its sole purpose is to present some concepts of the invention in a simplified form as a prelude to the more detailed description that is presented later.

The present invention provides for a system that facilitates monitoring and controlling gate oxide layer formation, in particular in monitoring and controlling the thickness and uniformity of a gate oxide layer employed in forming a stacked gate oxide. An exemplary system may employ one or more light sources arranged to project light on one or more gate oxide layers on a wafer and one or more light sensing devices (e.g., photo detector, photo diode) for detecting light reflected by the one or more gate oxide layers. The light reflected from the one or more gate oxide layers is indicative of at least gate oxide layer thickness, which may vary during the gate oxide layer formation process and/or gate oxide layer uniformity, which may similarly vary during the gate oxide layer formation process.

One or more gate oxide layer formers can be arranged to correspond to a particular wafer portion. Each gate oxide layer former may be responsible for forming a gate oxide layer on one or more particular wafer portions. The gate oxide layer formers are selectively driven by the system to form a gate oxide layer on one or more particular wafer portions at a desired thickness and/or desired uniformity.

The progress of the gate oxide layer formation is monitored by the system by comparing the thickness and/or uniformity of the gate oxide layer on a wafer to a desired thickness and/or uniformity. Different wafers and even different components within a wafer may benefit from varying gate oxide thickness and/or uniformity. By monitoring gate oxide thickness and/or uniformity at one or more wafer portions, the present invention enables selective control of gate oxide formation. As a result, more optimal gate oxide formation is achieved, which in turn improves MOSFET device manufacturing. One aspect of the present invention is directed at gate oxides having a thickness less than about 2 nanometers. Another aspect of the present invention is directed at gate oxides having a thickness less than about 1 nanometers. Still another aspect of the present invention is directed at gate oxides having a thickness less than about 50 nanometers and another aspect of the present invention is directed at gate oxides having a thickness less than about 20 nanometers.

One particular aspect of the invention relates to a system for regulating gate oxide layer formation in MOSFET devices. The system includes one or more stacked gate oxide sublayer formers operative to form one or more stacked gate oxide sublayers on a portion of a wafer. The stacked gate oxide sublayers can be formed, for example, from silicon, oxygen and nitrogen combined to form materials including, but not limited to, silicon oxide, silicon nitride, and silicon oxynitride. The gate oxide layer can be of a thickness between 0.5 and 20 nanometers. The system also includes a stacked gate oxide sublayer former driving system for driving a stacked gate oxide sublayer former and a system for directing light on to a portion of the wafer. The system further includes a measuring system for measuring parameters of gate oxide formation thickness and/or uniformity based on light reflected from gate oxide formations and a processor that receives gate oxide formation thickness and/or uniformity data from the measuring system. The processor uses the data to generate feedback information that can be employed to base control of a gate oxide former so as to regulate gate oxide thickness and/or uniformity on the portion of the wafer.

Another aspect of the present invention provides a method for regulating gate oxide layer formation. The method includes defining a wafer as a plurality of portions and establishing one or more gate oxide layer formations to be formed in the one or more portions. The method further includes directing light onto the gate oxide layer formations, collecting light reflected from the gate oxide layer formations and analyzing the reflected light to determine thickness and/or uniformity of the gate oxide layer formation. Once the reflected light has been analyzed, the method proceeds to generating feedback information that can be employed in controlling gate oxide layer formers to regulate gate oxide formation.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

Prior Art

DETAILED DESCRIPTION OF THE INVENTION

The present invention will now be described with reference to the drawings, wherein like reference numerals are used to refer to like elements throughout. The present invention will be described with reference to a system for controlling gate oxide layer formation using one or more gate oxide layer formers and a scatterometry system. It should be understood that the description of these exemplary aspects are merely illustrative and that they should not be taken in a limiting sense.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks may be employed.

Figure 2:
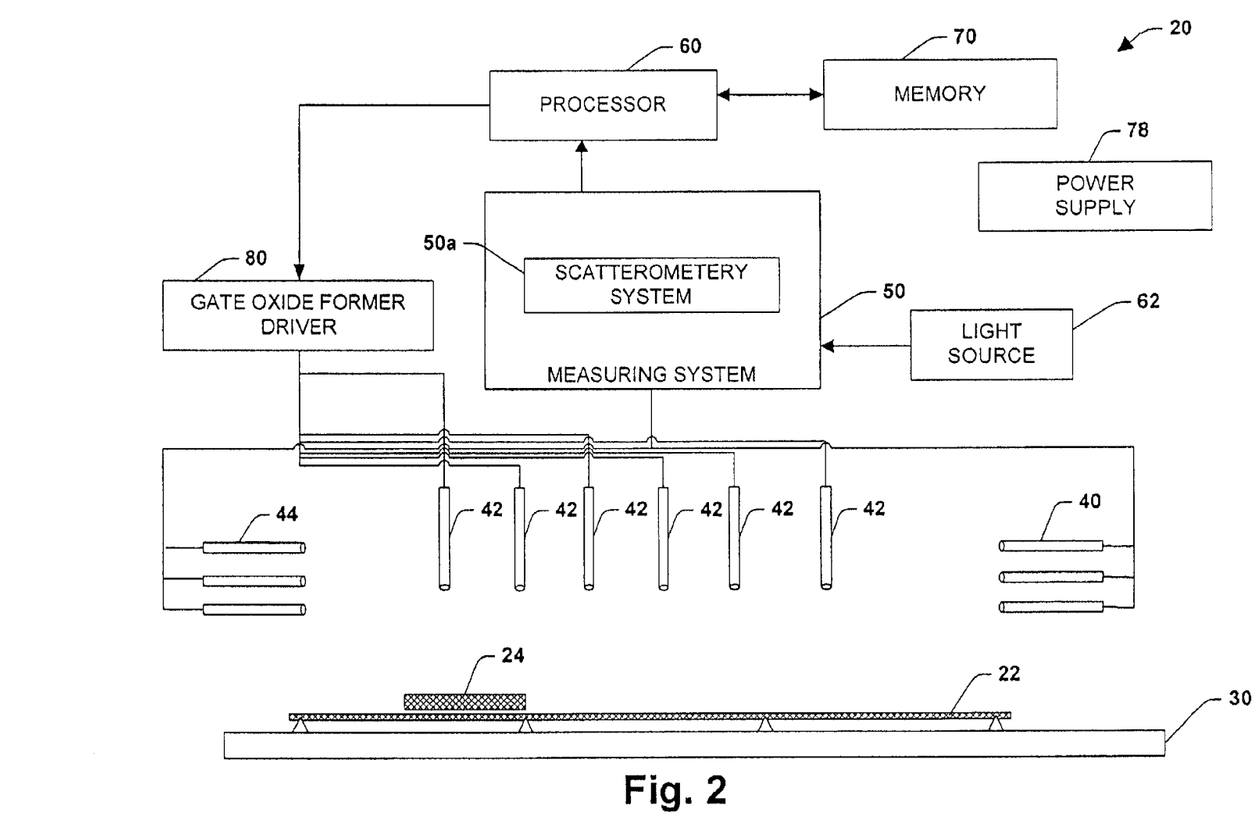
FIG. 2 is schematic block diagram of a gate oxide layer formation monitoring system in accordance with the present invention.

Referring now to FIG. 2, a system 20 for controlling gate oxide layer formation on a wafer 22 is shown (one or more gate oxide layer formations 24 may be formed on the wafer 22). It is to be appreciated that a gate oxide layer formation 24 can be formed, for example, from oxygen, silicon and nitrogen to form one or more materials including, but not limited to, silicon oxide, silicon nitride and silicon oxynitride layers. It is to be appreciated that a gate oxide layer may be a stacked gate oxide sublayer and that the gate oxides may include but are not limited to metal oxides such as $ZrO_2$, $HfO_2$, $Al_2O_3$, $TiO_2$, $Y_2O_3$, $La_2O_3$, $Nb_2O_5$, etc. and metal silicates of these metals. The gate oxide layer may be high K materials including, but not limited to titanates and niobates of Ba, Ca, Sr, La etc., such as $SrTiO_3$, $BaTiO_3$ or their ternary compounds. It is to be further appreciated that such gate oxide layers can be formed employing techniques including, but not limited to chemical vapor deposition, rapid thermal oxidation, metalorganic CVD (MOCVD), atomic layer CVD (ALCVD), pulsed laser deposition (PLD), oxide growth and other deposition processes.

The system 20 further includes one or more stacked gate oxide sublayer formers 42 that are selectively controlled by the system 20 so as to facilitate controlled formation of gate oxide layers on the wafer 22. As shown, the stacked gate oxide sublayer formers 42 are merely representative of apparatus required to make a stacked gate oxide sublayer, such as CVD equipment. A detailed illustration of such apparatus is not required for understanding the invention, as such apparatus are known to those skilled in the art. One or more light sources 44 project light onto respective portions of the wafer 22. A portion may have one or more gate oxide layer formations 24 being formed on that portion. Light reflected by the one or more gate oxide layer formations 24 is collected by one or more light collecting devices 40 and is processed by a gate oxide layer formation parameter measuring system 50 to measure at least one parameter relating to the thickness and/or uniformity of the one or more gate oxide layer formations 24. The reflected light is processed with respect to the incident light in measuring the various parameters.

The measuring system 50 includes a scatterometry system 50a. It is to be appreciated that any suitable scatterometry system may be employed to carry out the present invention and such systems are intended to fall within the scope of the claims. A source 62 of light such as a laser, for example, provides light to the one or more light sources 44 via the measuring system 50. Preferably, the light source 62 is a frequency stabilized laser, however, it will be appreciated that any laser or other light source (e.g., laser diode or helium neon (HeNe) gas laser) suitable for carrying out the present invention can be employed.

A processor 60 receives the measured data from the measuring system 50 and determines the thickness and/or uniformity of respective gate oxide layer formations 24 on the portions of the wafer 22. In one aspect of the present invention, the processor 60 can be programmed to accommodate fashioning stacked gate oxides less than about 20 nanometers. In another aspect of the present invention, the processor 60 can be programmed to accommodate fashioning stacked gate oxides less than about 1 nanometer.

The processor 60 is operatively coupled to the measuring system 50 and is programmed to control and operate the various components within the gate oxide monitoring and controlling system 20 in order to carry out the various functions described herein. The processor, or CPU 60, may be any of a plurality of commercially available processors, (e.g., AMD ATHLON) and other similar and/or compatible processors. The manner in which the processor 60 can be programmed to carry out the functions relating to the present invention will be readily apparent to those having ordinary skill in the art based on the description provided herein. A memory 70, which is operatively coupled to the processor 60, is also included in the system 20 and serves to store program code executed by the processor 60 for carrying out operating functions of the system 20 as described herein. The memory 70 also serves as a storage medium for temporarily storing information such as measured gate oxide layer thickness, desired gate oxide layer thickness, gate oxide layer thickness tables, measured gate oxide layer uniformity, desired gate oxide layer uniformity, gate oxide layer tables, wafer coordinate tables, scatterometry information, and other data that may be employed in carrying out the present invention. A power supply 78 provides operating power to the system 20. Any suitable power supply (e.g., battery, line power) may be employed to carry out the present invention.

The processor 60 is also coupled to a stacked gate oxide sublayer former driving system 80 that drives the stacked gate oxide sublayer formers 42. The stacked gate oxide sublayer former driving system 80 is controlled by the processor 60 so as to selectively vary output of the respective stacked gate oxide sublayer formers 42. Each respective portion of the wafer 22 may have a corresponding stacked gate oxide sublayer former 42 associated therewith. The processor 60 is able to monitor the development of the various gate oxide layer formations 24 and selectively regulate the thickness and/or uniformity of each portion via the corresponding stacked gate oxide sublayer formers 42. As a result, the system 20 provides for regulating gate oxide layer formation 24 thickness and/or uniformity on the wafer 22, which in turn improves, for example, reliability of MOSFET devices manufactured employing the present invention. Although not shown, the wafer 22, the gate oxide layer formations 24, the chuck 30, the light sources 44, the light collecting devices 40 and the gate oxide layer formers 42 may be positioned within a processing chamber wherein certain parameters (e.g., temperature, pressure, atmosphere composition and the like) can be controlled.

Figure 3:
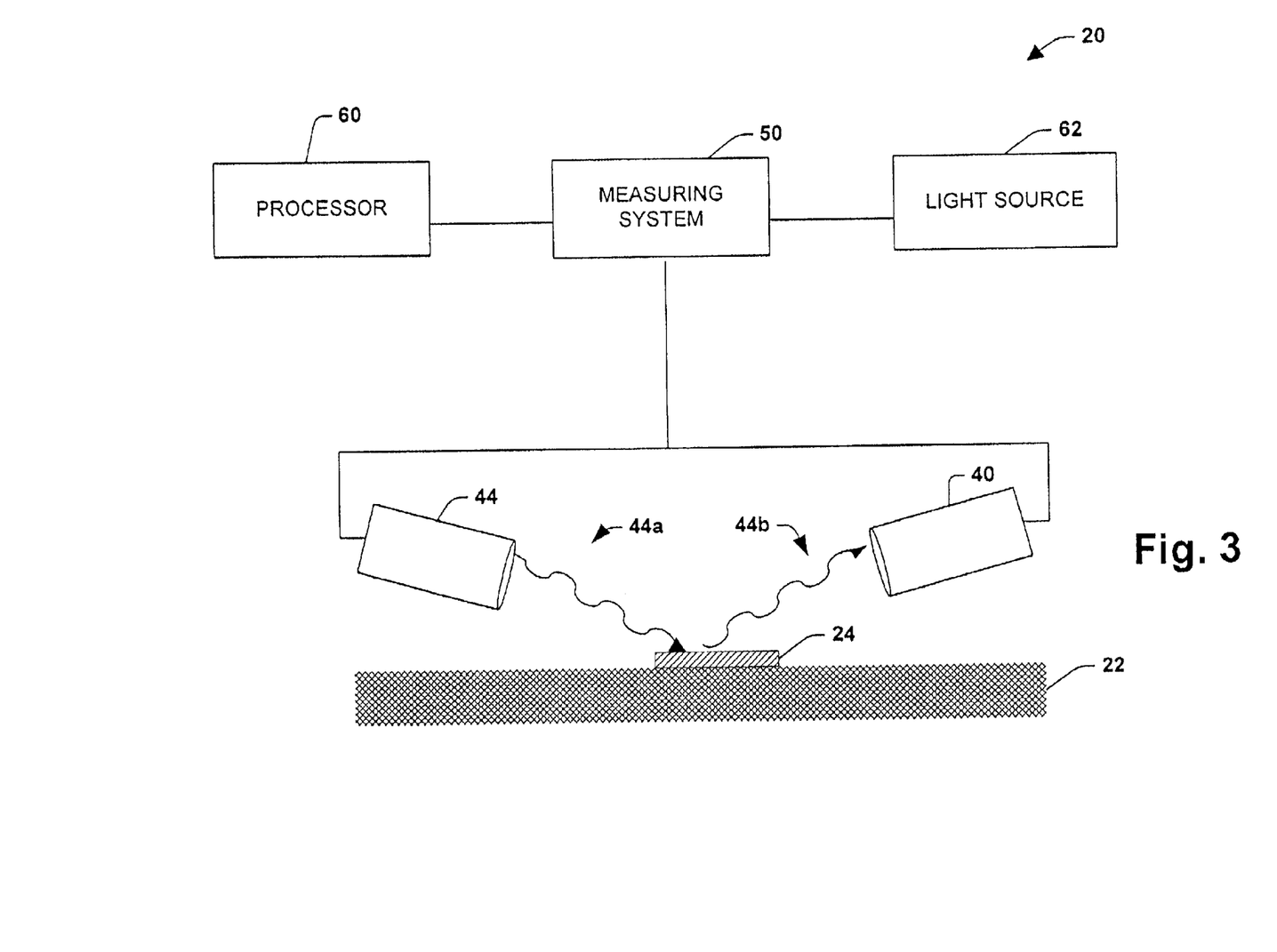
FIG. 3 is a partial schematic block diagram of the system of FIG. 2 being employed in connection with determining the thickness and/or uniformity of a gate oxide layer in accordance with the present invention.

FIG. 3 illustrates the system 20 being employed to measure the thickness and/or uniformity of gate oxide layer formations 24 on a wafer 22 at a particular location on the wafer. The light source 44 directs a light 44a incident to the surface of the wafer 22, and the angle of a reflected light 44b from the surface of the wafer 22 will vary in accordance with the thickness and/or uniformity of the gate oxide layer formation 24. The measuring system 50 collects the reflected light 44b and processes the reflected light 44b in accordance with scatterometry techniques to provide the processor 60 with data corresponding to the thickness and/or uniformity of the gate oxide layer formation 24.

Figure 4:
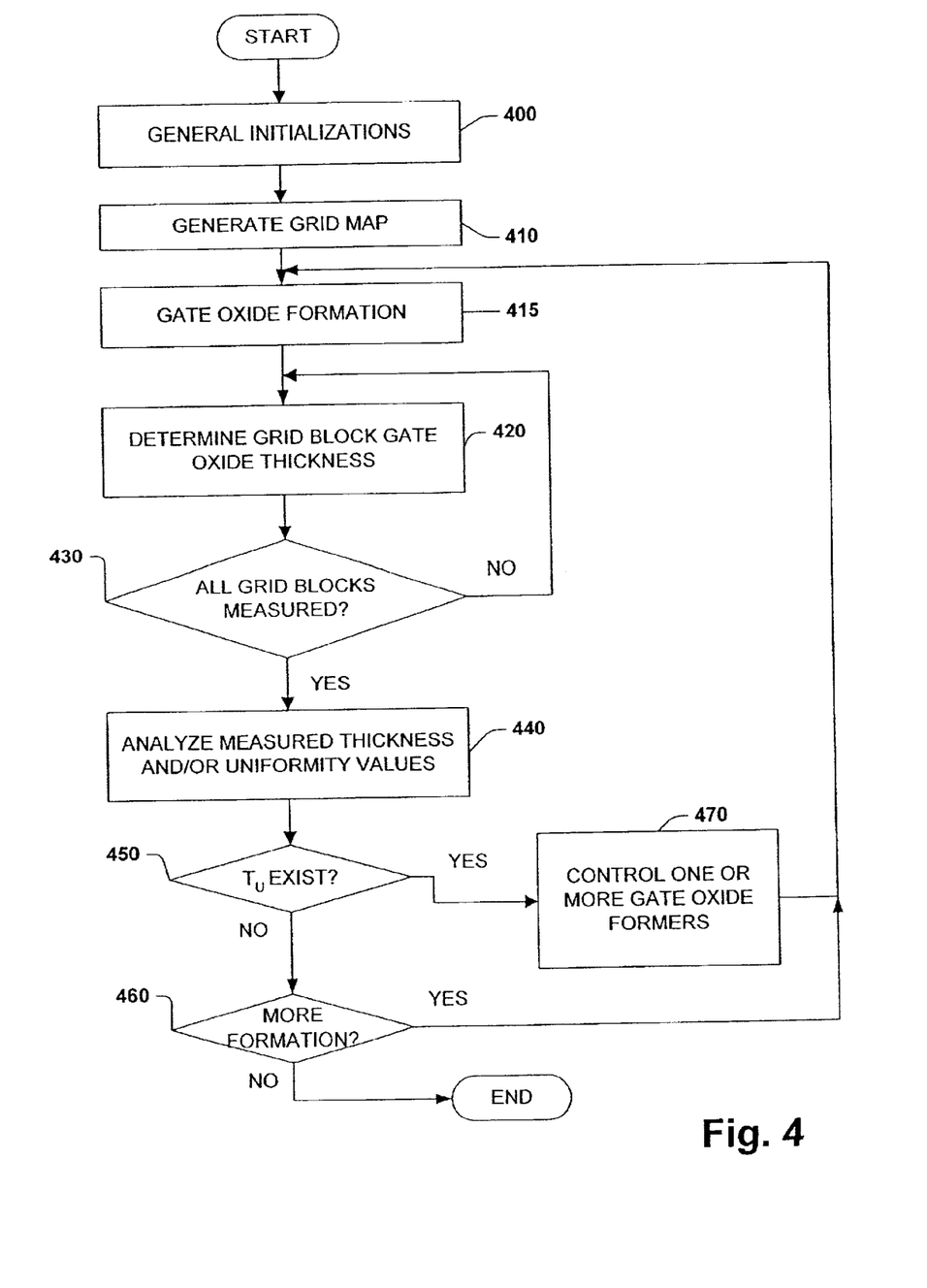
FIG. 4 is a flow diagram illustrating one specific methodology for carrying out the present invention.

In view of the exemplary systems shown and described above and below, a methodology, which may be implemented in accordance with the present invention, will be better appreciated with reference to the flow diagram of FIG. 4. While, for purposes of simplicity of explanation, the methodology of FIG. 4 is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 4 is a flow diagram illustrating one particular methodology for carrying out the present invention. At 400, general initializations are performed. Such initializations can include, but are not limited to, allocating memory, establishing pointers, establishing data communications, initializing variables and instantiating objects. At 410, at least a portion of a wafer is partitioned into a plurality of grid blocks "XY". At 415, at least a part of a gate oxide layer is formed. For example, an oxide layer can be formed through oxide growth involving wet thermoxidation.

At 420, thickness and/or uniformity determinations are made with respect to the various wafer portions mapped by respective grid blocks XY. At 430, a determination is made concerning whether all grid block measurements have been taken. If the determination at 430 is NO, then processing returns to 420. If the determination at 430 is YES, then at 440 the determined thickness and/or uniformity values are compared to acceptable thickness levels for the respective portions of the wafer. Thus, controlling the thickness of a stacked gate oxide sublayer is facilitated and in one aspect of the present invention, the thickness of the gate oxide layer can be controlled to be less than about 20 nanometers. In another aspect of the present invention, the thickness of the gate oxide layer can be controlled to be less than about 1 nanometer. At 450, a determination is made concerning whether any unacceptable thickness and/or uniformity values exist. If the determination at 450 is NO, that all thickness and/or uniformity values are acceptable, then at 460 a determination is made concerning whether further formation is required. If the determination at 460 is NO, then processing completes. If the determination at 460 is YES, then processing continues at 415. If the determination at 450 was YES, that unacceptable thickness and/or uniformity values were found, then at 470 the unacceptable thickness and/or uniformity values are analyzed. After the analyses of 470, feedback information can be generated to control gate oxide layer formers corresponding to grid blocks with unacceptable thickness and/or uniformity values, to regulate characteristics of gate oxide formation on the respective wafer portions. For example, information concerning the time remaining for gate oxide formation and/or the temperature at which such gate oxide formation should occur can be generated. The present iteration is then ended and the process returns to 415 to perform another iteration.

Generating such feedback control information facilitates more precisely controlling the thickness of the gate oxide layer. Such precise control can facilitate achieving desired critical dimensions, with resulting increases in semiconductor performance.

Figure 5:
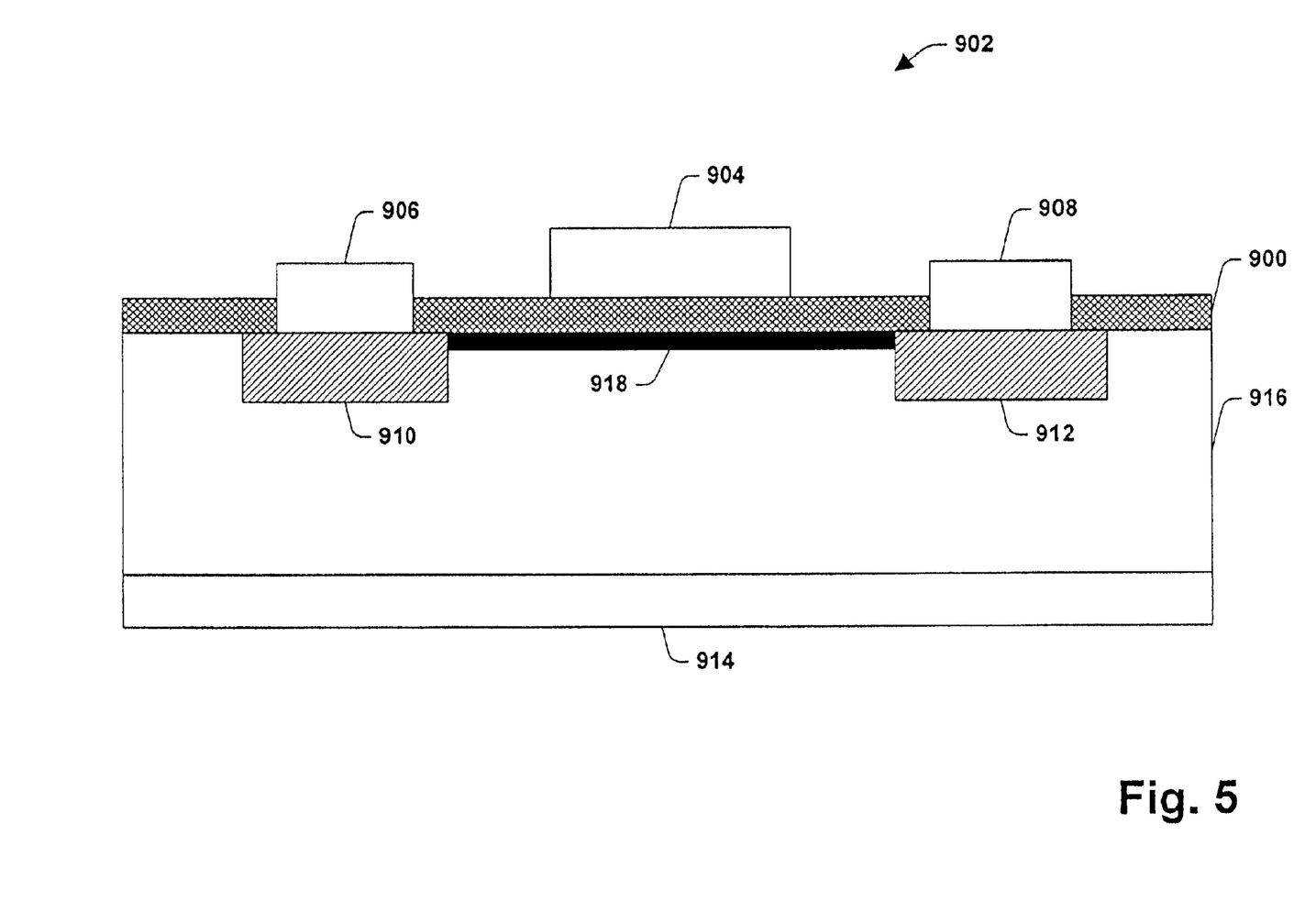
FIG. 5 illustrates a gate oxide layer in an n-type Metal-Oxide-Semiconductor-Field-Effect-Transistor (MOSFET).

FIG. 5 illustrates a gate oxide layer 900 in an n-type Metal-Oxide-Semiconductor-Field-Effect-Transistor (MOSFET) 902. Precisely controlling the thickness and/or uniformity of the gate oxide layer 900 leads to improvements in the reliability of the MOSFET 902. The present invention facilitates controlling the thickness and/or uniformity of the gate oxide layer 900 by collecting scatterometry data associated with the oxide layer 900 during formation. Thus, in one aspect of the present invention, the thickness of the gate oxide layer 900 can be controlled to be less than about 20 nanometers. In another aspect of the present invention, the thickness of the gate oxide layer 900 can be controlled to be less than about 1 nanometer.

Data collected during the formation of the gate oxide layer 900 can be analyzed and employed to produce information that can be fed back to control the formation process. For example, if the gate oxide layer 900 is being formed by thermal oxidation, the analyzed scatterometry data can be employed to generate feedback information operable to control the time over which the oxide growth should continue and/or the temperature at which the continued oxide growth should occur to facilitate achieving a desired thickness.

The MOSFET 902 includes a gate 904 electrically connected by external wiring (not shown) to a back contact 914. The gate 904 is also electrically connected by wiring (not shown) to a source electrode 906 associated with an n-source 910 and to a drain electrode 908 associated with an n-drain 912. The MOSFET 902 also includes an inversion layer 918 and a p-substrate 916. In the exemplary MOSFET 902 illustrated, the gate oxide 900 is situated between the gate 904 and the inversion layer 918. Reliable operation of the MOSFET 902 can be enhanced by monitoring and controlling the formation of the gate oxide 900 so that a desired thickness and/or uniformity in the gate oxide 900 is achieved.

Figure 6:
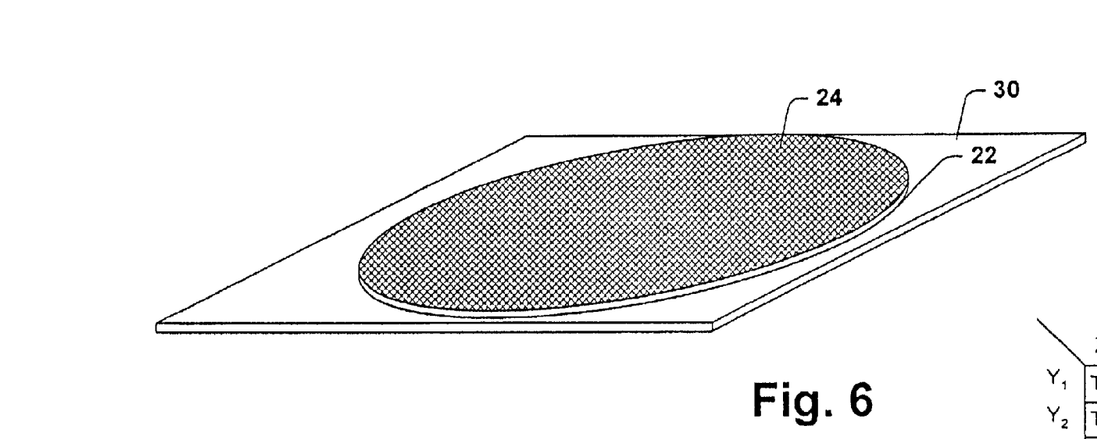
FIG. 6 is a perspective illustration of a substrate having a gate oxide layer deposited thereon in accordance with the present invention.
Figure 7:
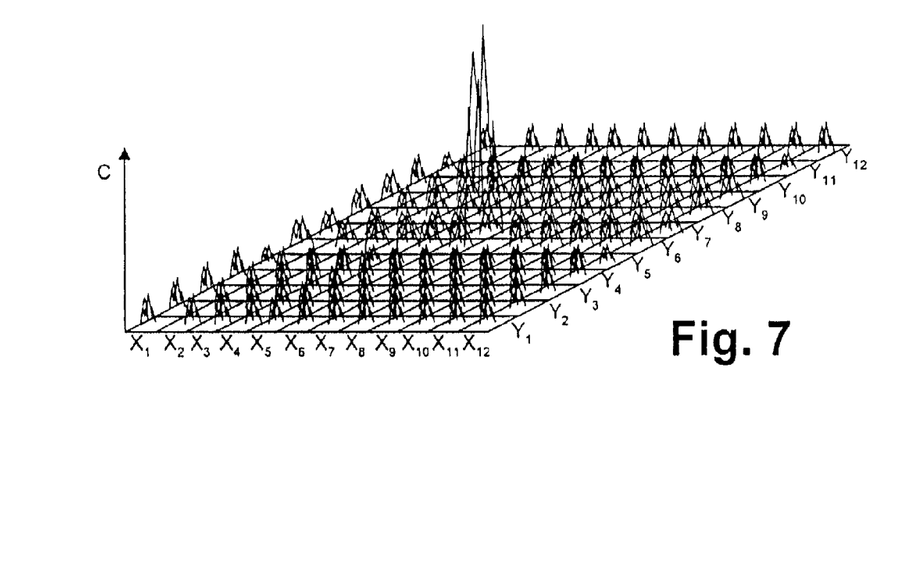
FIG. 7 is a representative three-dimensional grid map of a gate oxide layer formation illustrating gate oxide layer thickness and/or uniformity measurements taken at grid blocks of the grid map in accordance with the present invention.
Figure 8:
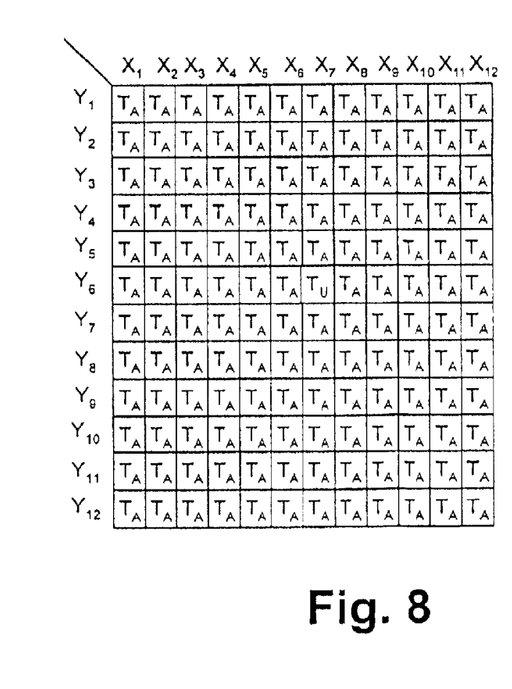
FIG. 8 is a gate oxide layer thickness and/or uniformity measurement table correlating the gate oxide thickness and/or uniformity measurements of FIG. 6 with desired values for the thickness and/or uniformity measurements in accordance with the present invention.

Turning now to FIGS. 6–8 the chuck 30 is shown in perspective supporting the wafer 22 whereupon one or more gate oxide layer formations 24 may be formed. The wafer 22 can be divided into a grid pattern as that shown in FIG. 6. Each grid block (XY) of the grid pattern corresponds to a particular portion of the wafer 22 and each grid block may have one or more gate oxide layer formations 24 associated with that grid block. Each portion is individually monitored for gate oxide thickness and/or uniformity and each portion is individually controlled for gate oxide formation.

In FIG. 7, each gate oxide layer formation 24 in each respective portion of the wafer 22 ($X_1Y_1 \ldots X_{12}, Y_{12}$) is being monitored for thickness and/or uniformity using reflective light, the measuring system 50 and the processor 60. The thickness of each gate oxide layer formation 24 is shown. The present invention facilitates controlling gate oxide layer formation 24 thickness in ranges between 20 and 1 nanometers. As can be seen, the thickness at coordinate $X_7Y_6$ is substantially higher than the thickness of the other wafer 22 portions XY. It is to be appreciated that although FIG. 7 illustrates the wafer 22 being mapped (partitioned) into 144 grid block portions, the wafer 22 may be mapped with any suitable number of portions and any suitable number of gate oxide layer formations 24 can be monitored. Although the present invention is described with respect to one gate oxide former 42 corresponding to one grid block XY, it is to be appreciated that any suitable number of gate oxide layer formers 42 corresponding to any suitable number of grid blocks may be employed. It is to be further appreciated that although FIG. 7 illustrates measurements for gate oxide formation thickness, measurements for uniformity may also be taken.

FIG. 8 is a representative table of thickness measurements (taken for the various grid blocks) that have been correlated with acceptable thickness values for the portions of the wafer 22 mapped by the respective grid blocks. As can be seen, all the grid blocks, except grid block $X_7Y_6$ have thickness measurements corresponding to an acceptable thickness value ($T_A$) (e.g., are within an expected range of thickness measurements), while grid block $X_7Y_6$ has an undesired thickness value ($T_U$). Thus, the processor 60 has determined that an undesirable thickness condition exists at the portion of the wafer 22 mapped by grid block $X_7Y_6$. Accordingly, the processor 60 can drive the gate oxide layer former $42_{7,6}$, which corresponds to the portion of the wafer 22 mapped at grid block $X_7Y_6$ to bring the gate oxide thickness of this portion of the wafer 22 to an acceptable level. It is to be appreciated that the gate oxide layer formers 42 may be driven so as to maintain, increase and/or decrease the rate of gate oxide formation of the respective wafer 22 portions as desired. It is to be appreciated by one skilled in the art that although FIG. 8 illustrates measurements for gate oxide formation thickness, that measurements for uniformity may also be taken.

Scatterometry is a technique for extracting information about a surface upon which an incident light has been directed. Information concerning properties including, but not limited to, dishing, erosion, profile, thickness of thin films and critical dimensions of features present on the surface can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

To illustrate the principles described above, reference is now made to FIGS. 9 through 12.

Figure 9:
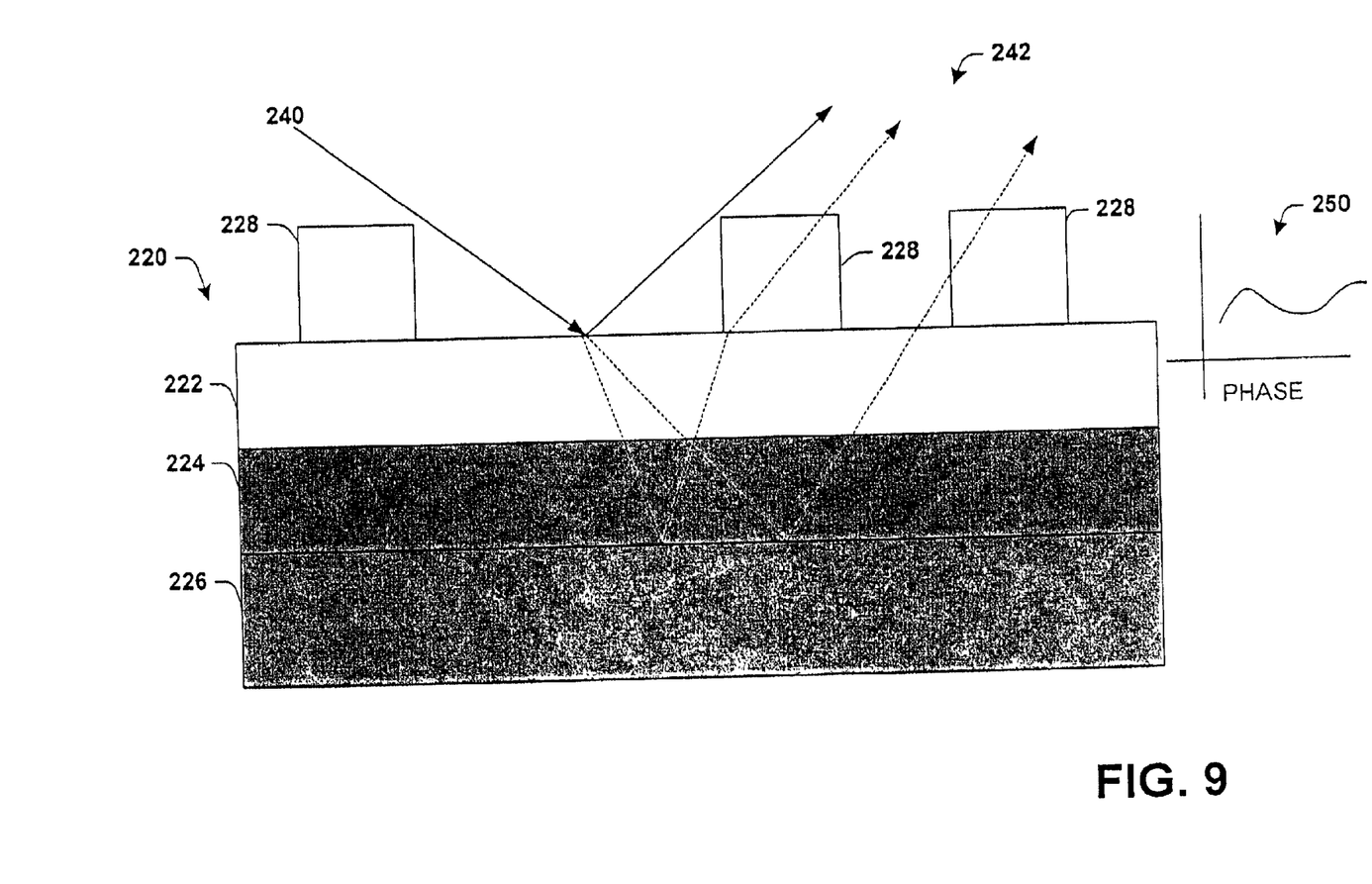
FIG. 9 illustrates a complex reflected and refracted light produced when an incident light is directed onto a surface, in accordance with an aspect of the present invention.

Turning now to FIG. 9, complex reflections and refractions of an incident light 240 are illustrated. The reflection and refraction of the incident light 240 can be affected by factors including, but not limited to, the presence of one or more features 228, and the composition of the substrate 220 upon which the features 228 reside. For example, properties of the substrate 220 including, but not limited to the thickness of a layer 222, the chemical properties of the layer 222, the opacity and/or reflectivity of the layer 222, the thickness of a layer 224, the chemical properties of the layer 224, the opacity and/or reflectivity of the layer 224, the thickness of a layer 226, the chemical properties of the layer 226, and the opacity and/or reflectivity of the layer 226 can affect the reflection and/or refraction of the incident light 240. Thus, a complex reflected and/or refracted light 242 may result from the incident light 240 interacting with the features 228, and/or the layers 222, 224 and 226. Although three layers 222, 224 and 226 are illustrated in FIG. 9, it is to be appreciated by one skilled in the art that a dielectric can be formed of a greater or lesser number of such layers.

Figure 10:
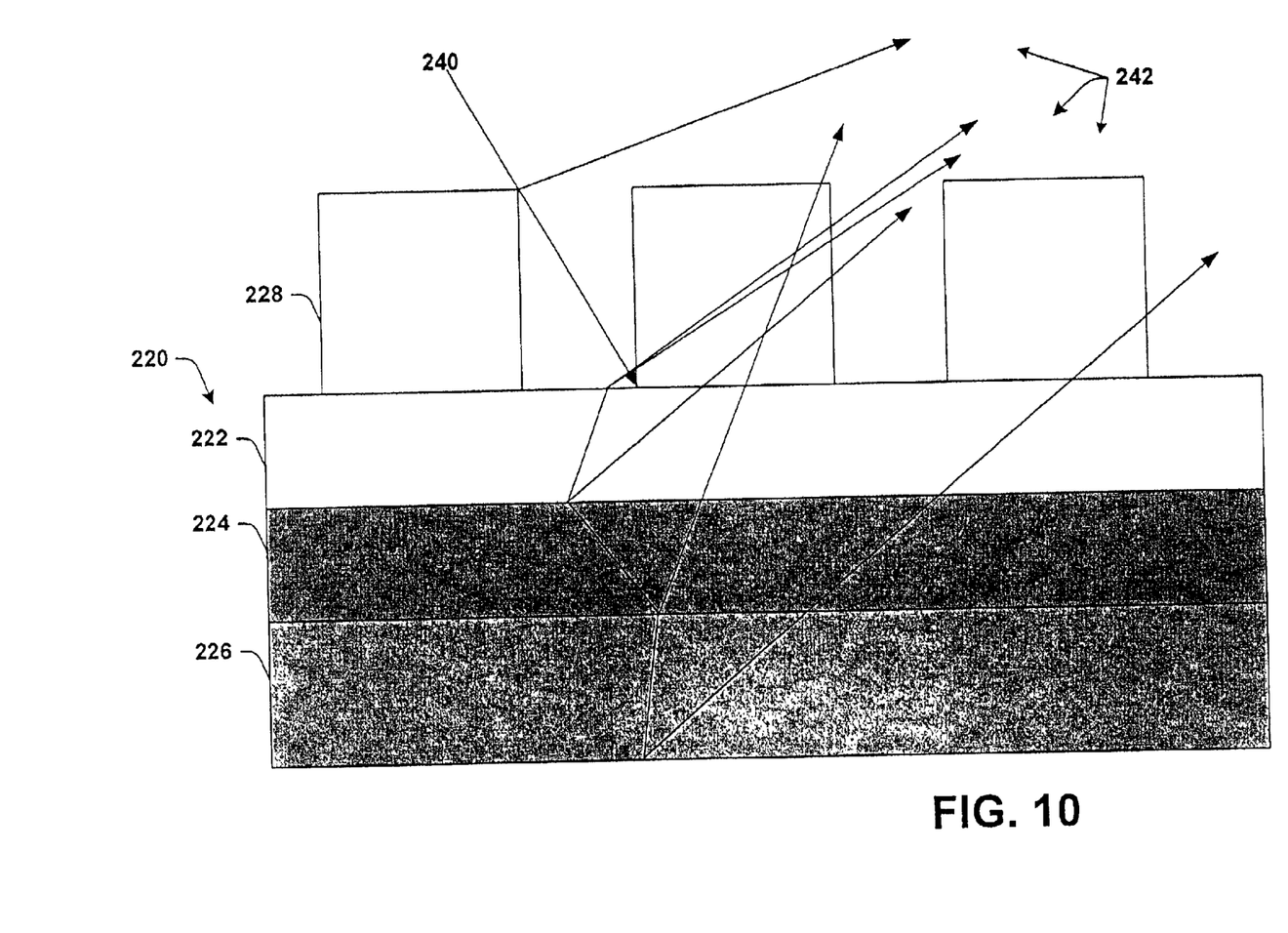
FIG. 10 illustrates a complex reflected and refracted light produced when an incident light is directed onto a surface, in accordance with an aspect of the present invention.
Figure 11:
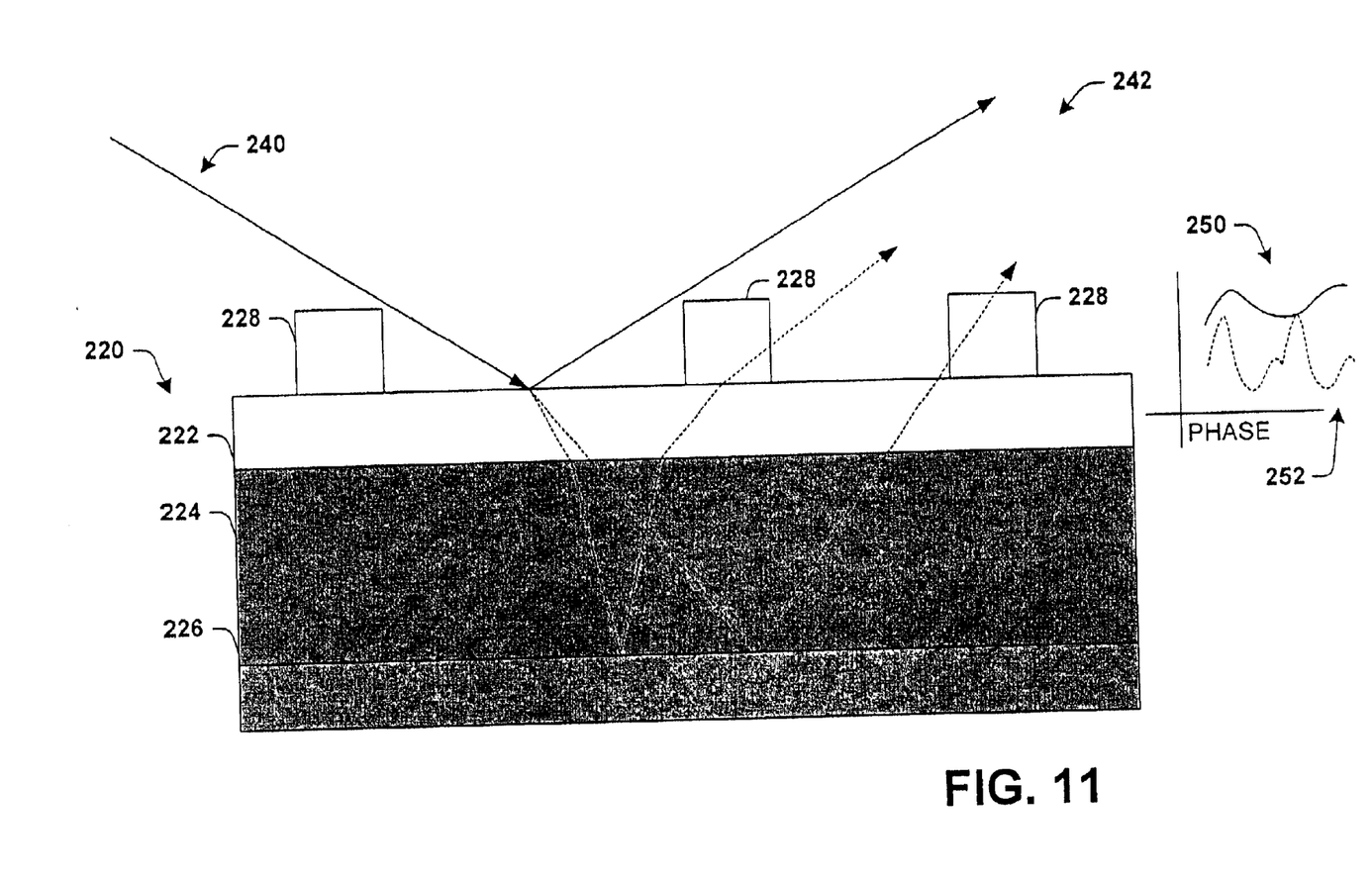
FIG. 11 illustrates a complex reflected and refracted light produced when an incident light is directed onto a surface, in accordance with an aspect of the present invention.
Figure 12:
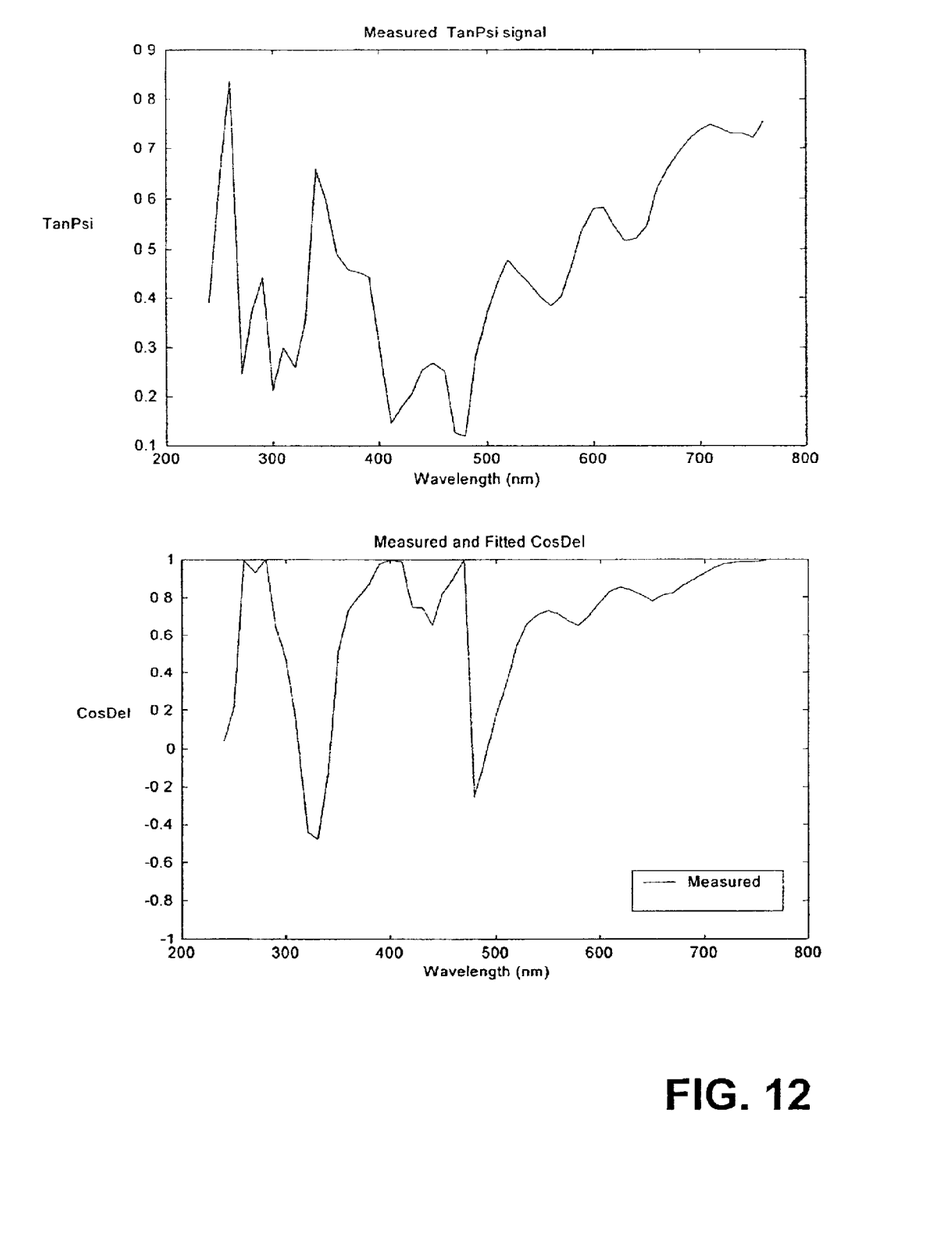
FIG. 12 illustrates phase and intensity signals recorded from a complex reflected and refracted light produced when an incident light is directed onto a surface, in accordance with an aspect of the present invention.

Turning now to FIG. 10, one of the properties from FIG. 9 is illustrated in greater detail. The dielectric 220 can be formed of one or more layers 222, 224 and 226. For example, layer 222 may be an oxide layer, layer 224 may be a nitride layer, and layer 226 may be an oxide layer. The phase 250 of the reflected and/or refracted light 242 can depend, at least in part, on the thickness of a layer, for example, the layer 224. Thus, in FIG. 11, the phase 252 of the reflected light 242 differs from the phase 250 due, at least in part, to the different thickness of the layer 224 in FIG. 11. Although in FIG. 12 the phase is measured and plotted in association with FIGS. 10 and 11, changes to intensity may also be measured and plotted in accordance with the present invention.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

Figure 13:
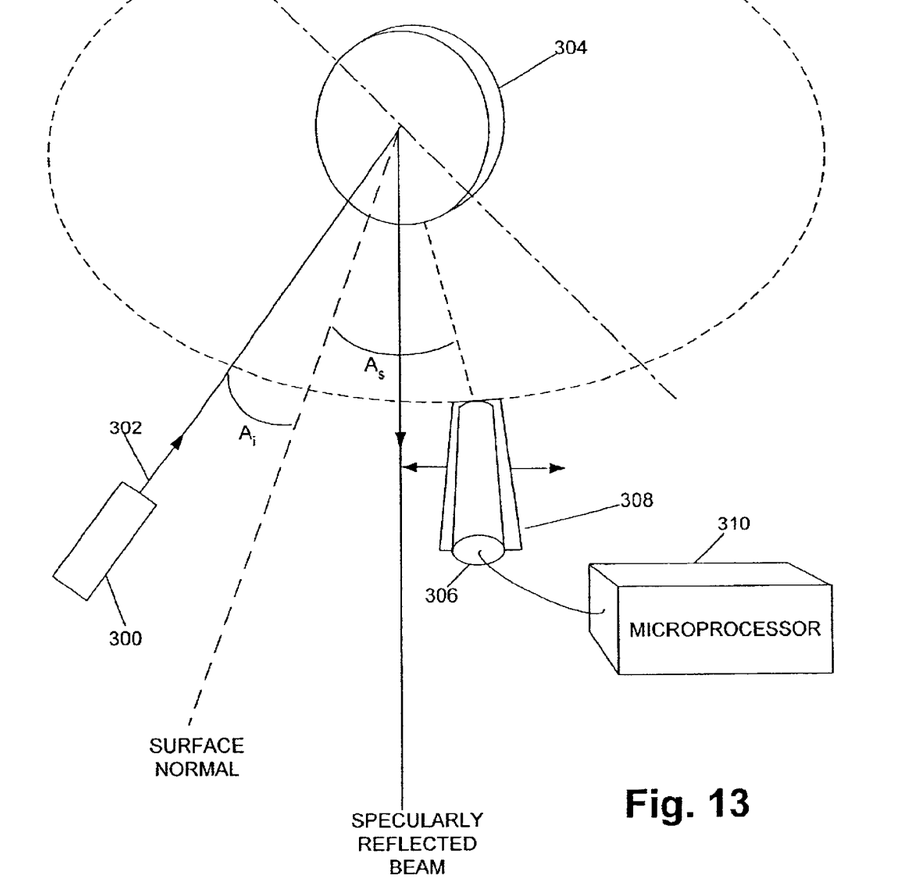
FIG. 13 is an example scatterometry system collecting reflected light in accordance with an aspect of the present invention.

FIG. 13 illustrates an exemplary scatterometry system collecting reflected light. Light from a laser 300 is brought to focus in any suitable well-known manner to form a beam 302. A sample, such as a wafer 304 is placed in the path of the beam 302 and a photo detector or photo multiplier 306 of any suitable well-known construction. Different detector methods may be employed to determine the scattered power. To obtain a grating pitch, the photo detector or photo multiplier 306 may be mounted on a rotation stage 308 of any suitable well-known design. A microprocessor 310, of any suitable well-known design, may be used to process detector readouts, including but not limited to angular locations of different diffracted orders leading to diffraction grating pitches being calculated. Thus, light reflected from the sample 304 may be accurately measured.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for regulating gate oxide layer formation, comprising:

defining a wafer as a plurality of portions;

establishing one or more gate oxide layer formations to be formed;

directing light onto at least one of the gate oxide layer formations;

collecting light reflected from at least one gate oxide layer formation;

analyzing the reflected light to determine thickness and/or uniformity of the at least one gate oxide layer formation; and controlling one or more gate oxide layer formers to regulate gate oxide formation of the at least one gate oxide layer formation.

2. The method of claim 1, wherein analyzing the reflected light further comprises:

employing a scatterometry system to process the reflected light.

3. The method of claim 1, where the gate oxide layer is a high K material.

4. The method of claim 1, where the gate oxide layer is a metal oxide.

5. The method of claim 1, further comprising:

using a processor to control the at least one gate oxide former based at least partially on data received from the scatterometry system.

6. The method of claim 5, further comprising:

using a processor to control the at least one gate oxide former based at least partially on data received from the scatterometry system.

7. A method for regulating gate oxide layer formation, comprising:

partitioning a wafer into a plurality of grid blocks;

using one or more gate oxide layer formers to form one or more gate oxide layers on the wafer, each gate oxide former functionally corresponding to a respective grid block;

determining thickness and/or uniformity of the one or more gate oxide layer formations on one or more portions of the wafer, each portion corresponding to a respective grid block; and using a processor to coordinate control of the gate oxide layer formers, respectively, in accordance with determined gate oxide thickness and/or uniformity of the respective portions of the wafer.

8. A method for regulating gate oxide layer formation, comprising:

defining a wafer as a plurality of portions;

establishing one or more gate oxide layer formations to be formed;

directing light onto at least one of the gate oxide layer formations;

collecting light reflected from at least one gate oxide layer formation;

analyzing the reflected light to determine thickness and/or uniformity of the at least one gate oxide layer formation by using a scatterometry system to process the reflected light; and controlling one or more gate oxide layer formers to regulate gate oxide formation of the at least one gate oxide layer formation.

9. The method of claim 8, where the gate oxide layer is a high K material.

10. The method of claim 8, where the gate oxide layer is a metal oxide.

11. The method of claim 8, further comprising:

using a processor to control the at least one gate oxide former based at least partially on data received from the scatterometry system.

12. The method of claim 11, further comprising:

using a processor to control the at least one gate oxide former based at least partially on data received from the scatterometry system.

13. The method of claim 8, where the gate oxide layer has a thickness of less than about 20 nanometers.

14. The method of claim 8, where the reflected light is analyzed to determine thickness of the at least one gate oxide layer formation.

15. A method for regulating gate oxide layer formation, comprising:

partitioning a wafer into a plurality of grid blocks;

using one or more gate oxide layer formers to form one or more gate oxide layers on the wafer, each gate oxide former functionally corresponding to a respective grid block;

determining thickness and/or uniformity of the one or more gate oxide layer formations on one or more portions of the wafer using a scatterometry system, each portion corresponding to a respective grid block; and using a processor to coordinate control of the gate oxide layer formers, respectively, in accordance with determined gate oxide thickness and/or uniformity of the respective portions of the wafer.

16. The method of claim 15, where the gate oxide layer is a high K material.

17. The method of claim 15, where the gate oxide layer is a metal oxide.

18. The method of claim 15, where the gate oxide layer has a thickness of less than about 20 nanometers.

19. The method of claim 15, where the thickness of the at least one gate oxide layer formation is determined.

* * * * *